United States Patent
Chang et al.

(10) Patent No.: US 6,340,944 B1
(45) Date of Patent: Jan. 22, 2002

(54) PROGRAMMABLE POWER CONSUMPTION PIPELINE ANALOG-TO-DIGITAL CONVERTER WITH VARIABLE RESOLUTION

(75) Inventors: Ronald Chang, Fremont; Jose A. Salcedo, Livermore; Raphael Horton, Pleasanton, all of CA (US)

(73) Assignee: Exar Corporation, Fremont, CA (US)

( * ) Notice: Subject to any disclaimer, the term of this patent is extended or adjusted under 35 U.S.C. 154(b) by 0 days.

(21) Appl. No.: 09/643,385

(22) Filed: Aug. 21, 2000

(51) Int. Cl.[7] .............................. H03M 1/44; H03M 1/38
(52) U.S. Cl. ....................................... 341/161; 341/163
(58) Field of Search ................................ 341/156, 161, 341/162, 163

(56) References Cited

U.S. PATENT DOCUMENTS 5,898,396 A * 4/1999 Shimomura et al. ........ 341/163

* cited by examiner

*Primary Examiner*—Howard L. Williams
(74) *Attorney, Agent, or Firm*—Townsend and Townsend and Crew LLP

(57) ABSTRACT

An analog-to-digital converter which has a low resolution and high resolution mode. In response to the low resolution mode signal, a switching circuit selects only certain of the digital bit outputs. In one embodiment, the analog-to-digital converter is a pipelined circuit with a number of stages. In response to the low resolution mode, a number of the stages are bypassed, so that only the needed stages for the smaller number of bits are used. The stages that are bypassed are preferably powered down, but not completely. By maintaining a small amount of bias current to the bypassed stages, they can quickly respond when a switch is made back to full resolution mode.

11 Claims, 4 Drawing Sheets

PROGRAMMABLE POWER CONSUMPTION PIPELINE ANALOG-TO-DIGITAL CONVERTER WITH VARIABLE RESOLUTION

BACKGROUND OF THE INVENTION

The present invention relates to analog-to-digital converters, and in particular to the reduction of power consumption for such circuits.

Portable, battery powered electronics are constantly optimizing circuitry to minimize power consumption. The goal in minimizing power consumption is to extend battery life. Many portable electronic devices require mixed-mode analog-to-digital converter (ADC) integrated circuits. Examples of these devices include video devices such as digital still cameras (DSC) and camcorders. These video devices are a particularly challenging design task because of the fidelity and high speed required in video processing. Typically, increased power consumption is required for the ADC in higher speed applications, such as video, to meet these design constraints. The invention described herein optimizes power consumption with a video application. The present invention provides an ADC design and methodology that minimizes power consumption for typical use of digital still cameras and camcorders. For the sake of simplicity, we will define two modes of user operation:

1. Recording mode.
2. Viewfinder mode.

Recording Mode

Mode 1, recording mode, is self descriptive. The user intends to record video during this time. A camcorder in this mode would be recording video to a storage media. A digital still camera would be recording a picture to storage media. These recording events are assumed to require full accuracy from the circuitry in use. For example, if the ADC had 12-bit capability, all 12 bits would be used. This assumption of performance is based on the user's expectation of the best image quality possible.

Viewfinder Mode

Mode 2, viewfinder mode, is a preview for playback mode. The user is typically viewing video on a liquid crystal display (LCD) during this mode. Users of DSCs and camcorders spend considerable time viewing video on the LCD in this mode. During this mode users are not recording video. This mode is further divided in two subsets of use: playback and preview.

Playback is the event of recalling video from a media to an LCD or NTSC output. It does not involve recording of video. The ADC circuitry in this more can simply be powered down and not used.

Preview is the event where ADC power is optimized in the present invention. Preview is the event of viewing video on an LCD, for example, but not recoding to a storage media. Examples of this event include framing a picture before it is taken and framing a subject in a camcorder prior to recording. ADC circuitry is used in this mode but storage media is not written to or accessed. The ADC in this mode can be optimized for power consumption. Users spend significant time in this mode of operation by comparison to other modes. In this preview mode it is assumed that less than best possible image performance (image performance during recording) is acceptable. An LCD, for example, has an 8-bit digital interface or 6-bit accurate NTSC interface. LCD preview performance in this mode is therefore limited to 6 or 8-bit system performance. An ADC digitizing video to a 12-bit level would therefore not need to be accurate to greater than 6 to 8 bits in the system. The ADC can utilize a lower resolution mode to match needed system performance and save power consumption.

SUMMARY OF THE INVENTION

The present invention provides an analog-to-digital converter which has a low resolution and high resolution mode. In response to the low resolution mode signal, a switching circuit selects only certain of the digital bit outputs.

In one embodiment, the analog-to-digital converter is a pipelined circuit with a number of stages. In response to the low resolution mode, a number of the stages are bypassed, so that only the needed stages for the smaller number of bits are used. The stages that are bypassed are preferably powered down, but not completely. By maintaining a small amount of bias current to the bypassed stages, they can quickly respond when a switch is made back to full resolution mode.

In one preferred embodiment, the output bits are also switched so that they are shifted over from the LSB positions to the MSB positions. In another aspect of this embodiment, a latency matching circuit, such as D-latches are used to maintain an equal latency for both high resolution and low resolution modes. Thus, the D-latches provide the latency that would otherwise have been provided by the bypassed stages.

For a further understanding of the nature and advantages of the invention, reference should be made to the following description taken in conjunction with the accompanying drawings.

DESCRIPTION OF THE SPECIFIC EMBODIMENTS

The ADC of the present invention was designed to minimize power consumption using a lower resolution mode when needed in a video application as described in the background above. A pipeline architecture was selected in a preferred embodiment for power and/or speed advantages over flash or multi-step architectures. The lower resolution mode takes advantage of the inherent concurrent processing of analog signals in the pipeline architecture.

Figure 1:
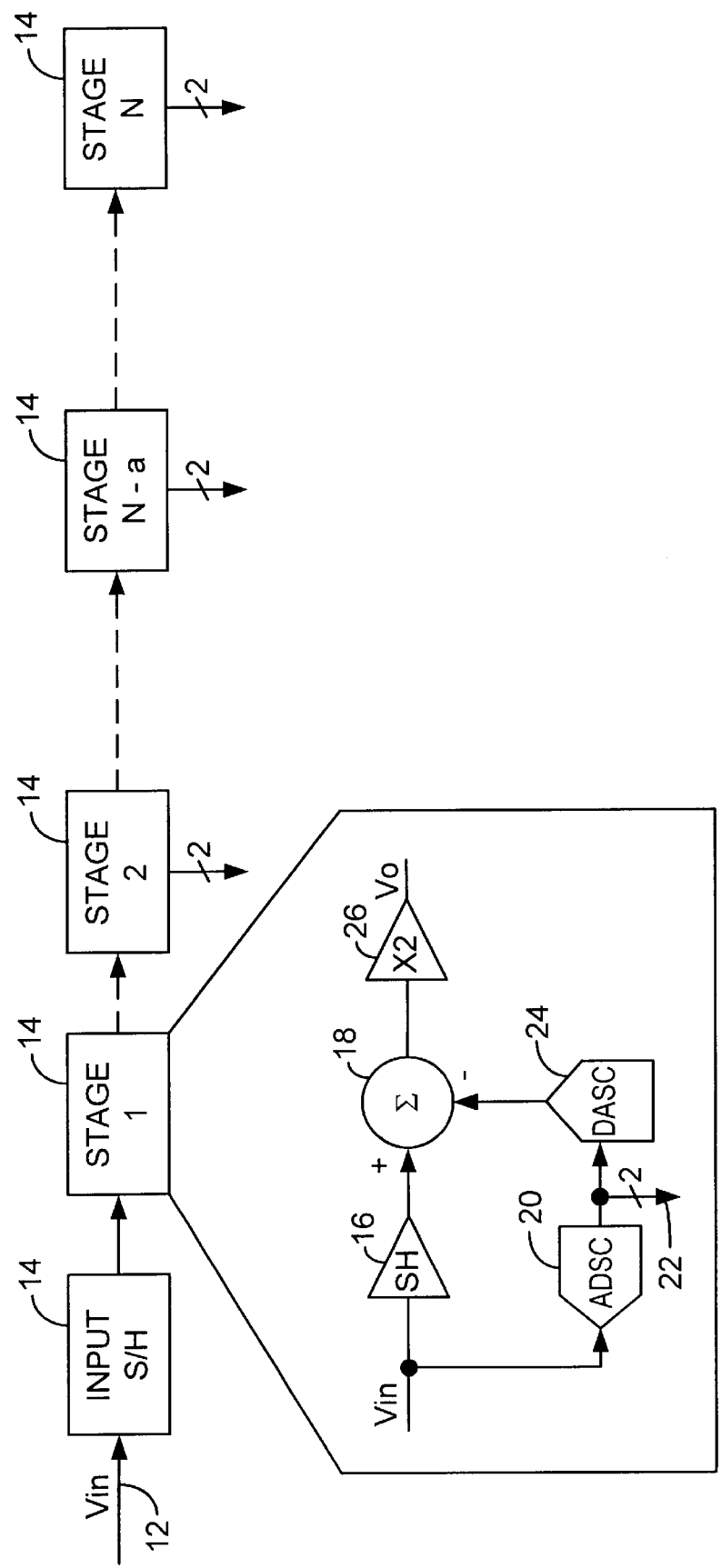
FIG. 1 is a block diagram of a prior art pipeline ADC.

A block diagram of a typical pipeline ADC is shown in FIG. 1. It consists of a cascade of N identical stages in which each stage performs a coarse quantization, a DAC (Digital to Analog Converter) function of the quantization result, and amplification of the remainder. A S/H (Sample and Hold) function in each stage allows all stages to operate concurrently, giving a throughput of one output sample per clock cycle.

The pipeline ADC architecture consists of many circuit stages. Each stage represents effectively 1-bit of resolution in the conversion process. The block diagram of the architecture is shown in FIG. 1. The lower resolution mode bypasses some of the circuit stages, effectively reducing the number of bits processed by the ADC. Unused circuit stages that were bypassed can be turned off, saving on total power dissipation.

The prior art ADC of FIG. 1 shows a voltage input 12 to the first of a number of stages 14. FIG. 1 illustrates a block diagram of one of the stages, showing a sample and hold circuit 16 connected as one input to a summing circuit 18. The other input of the summing circuit is provided through an analog-to-digital stage converter (ADSC) 20 which provides 2 bits of output on lines 22 for that stage. One of the bits is the digital bit for that stage, and the other is an error bit in one embodiment. The signal is then converted back into analog form through a digital-to-analog stage converter (DASC) 24, which is provided to the other input of summing circuit 18. This effectively subtracts off the portion of the signal already digitized, providing the remaining portion to a amplifier 26, which provides a gain of multiplying by two to boost the remaining signal up for the next stage, corresponding to a bit with the next lower power of two.

For more details of the operation of such a stage, reference could be made to U.S. Pat. No. 5,880,690, assigned to Exar Corporation and incorporated herein by reference. Additionally, another patent illustrating a pipelined ADC is set forth in U.S. Pat. No. 5,572,212, also assigned to Exar Corporation, and also incorporated herein by reference.

Figure 2:
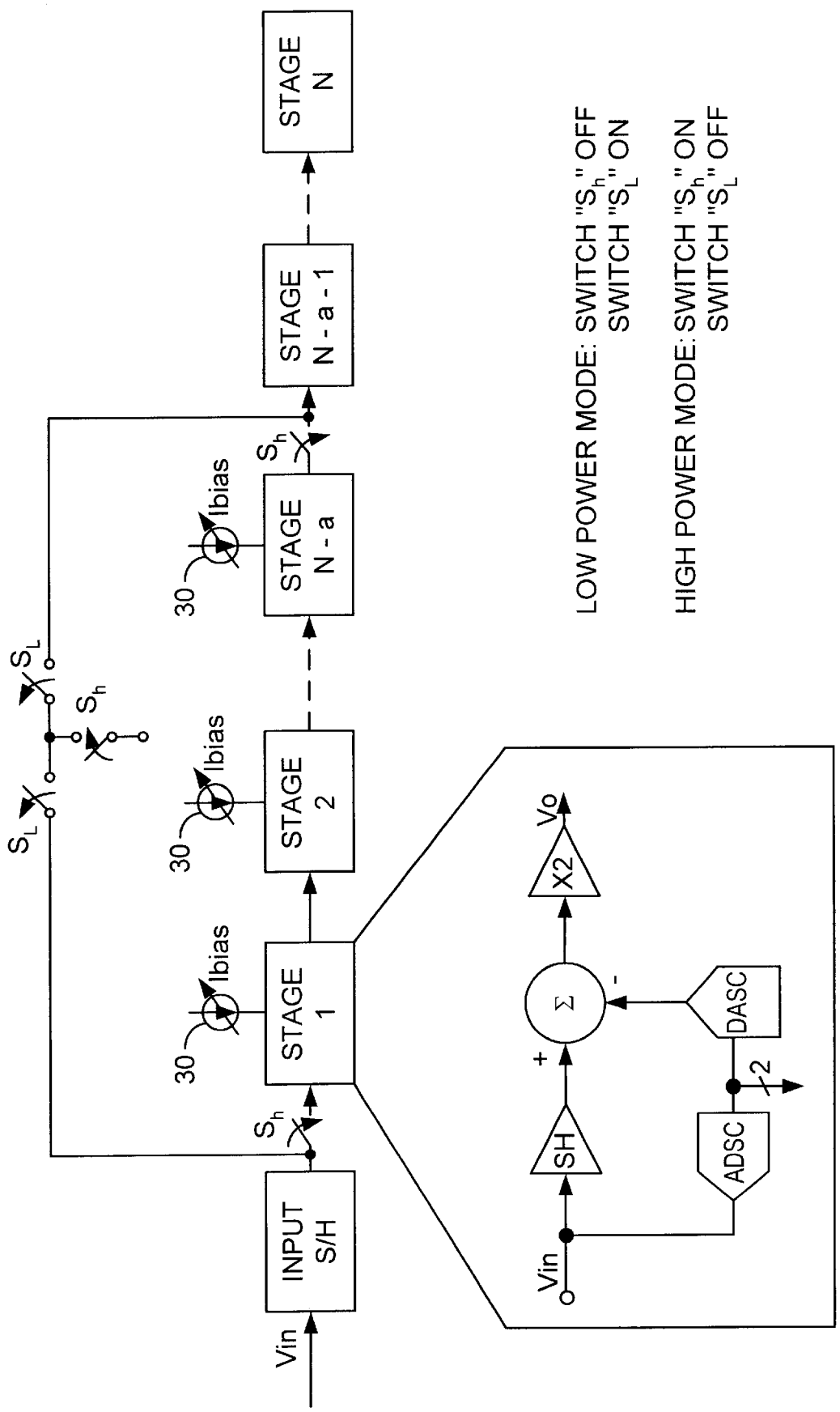
FIG. 2 is a diagram of a pipeline ADC incorporating the bypass switching of the invention.

FIG. 2 demonstrates the bypassing method. The ADC performs conversions at full resolution mode when all stages are used. The switches "Sh" turn on and the switches "SL" turn off, simultaneously in this mode. The analog signal to be digitized passes from the output of the S/H stage to input of stage 1 until all stages are complete.

When the switches "Sh" turn off and the switches "SL" turn on, the architecture is in lower resolution mode. The signal passes from the output of the S/H stage directly to the input of stage N-a-1.

Also shown for each of the bypass stages are the bias current circuits 30. When these stages are bypassed, the bias current can be reduced or shut off. Preferably, the current is simply reduced, such as by using multiple transistors in parallel to provide the current, and switching off all but one of the transistors. For example, two transistors in parallel could be used, with the larger transistor being shut off when the stage is bypassed.

Preferably, the unused circuit stages have their individual bias currents reduced by 87.5% of a master bias current. A reduced amount of current, as opposed to no current, is used to make sure recovery time is fast enough, when the circuit transitions back to high power mode. The recovery time is critical to the video application because full resolution is needed for the calibration routines in the video system. Circuits that turn off stages completely will take longer to recover to full accuracy.

In this typical application, we bypass 6 stages reducing resolution from 12-bits to 6-bits. Each individual stage can reduce power dissipation by 87.5% for that stage. The total power savings depends on the number of stages that are bypassed.

Figure 3:
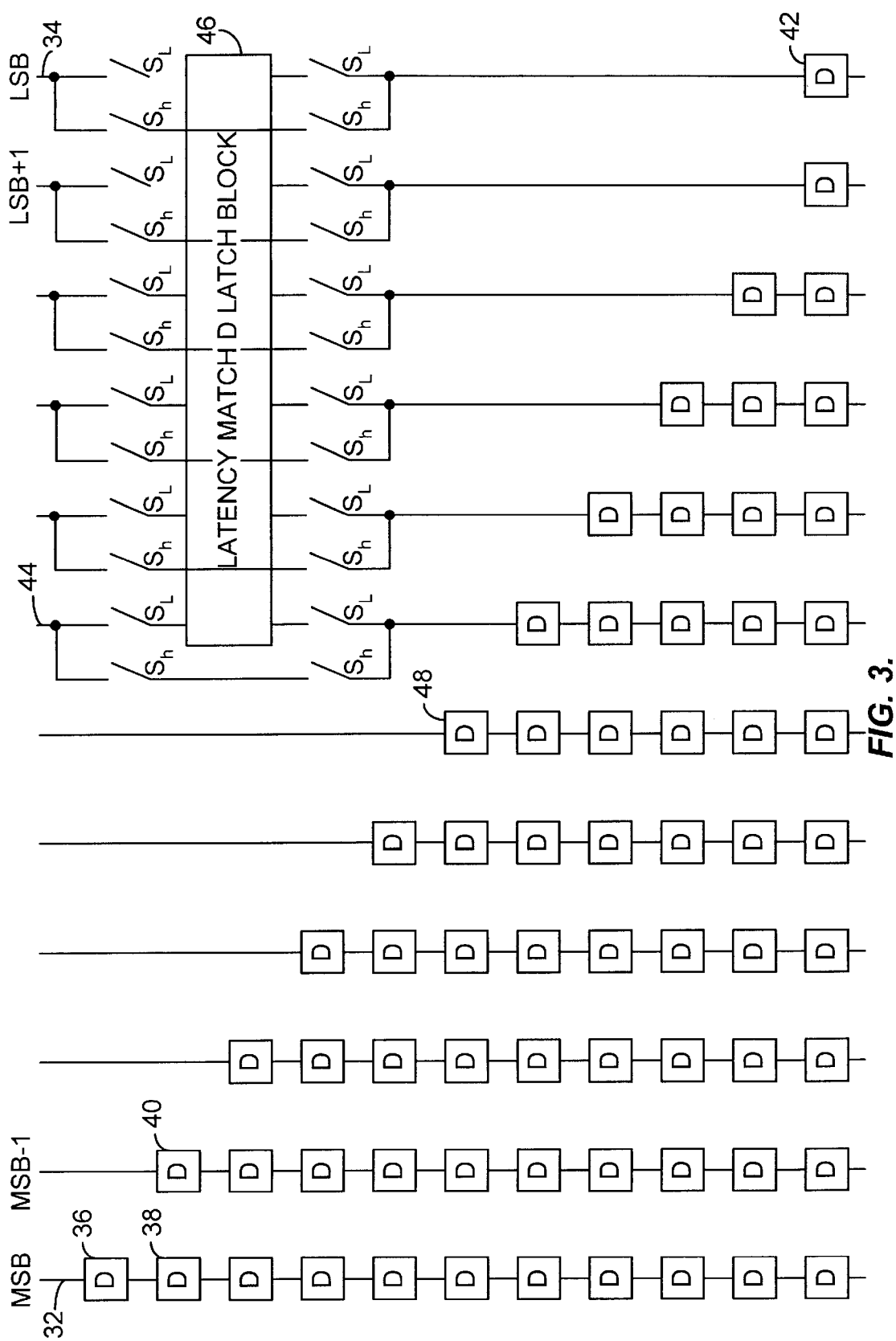
FIG. 3 is a block diagram illustrating the addition of the latency matching D-latch block of the invention.

Independent of lower resolution or full resolution mode, the ADC needs to maintain the same data latency. In the latch block as shown in FIG. 3, the circuit provides another three cycles for low resolution mode to match data latency between 12-bit resolution and 6-bit resolution. This simplifies the DSP requirements or software development required for ASICs to interface to the device. If the design did not have the same data latency the DSP or ASIC would have to adjust for two data latencies when the video camera switched between full and low resolution modes.

FIG. 3 illustrates multiple bit lines, starting with an MSB line 32 and extending to an LSB line 34. In normal, full resolution mode, all of the bit lines are used, with the data propagating with the illustrative latency shown by the blocks. A first block 36 would illustrate the transition through the initial stage, then second blocks 38 and 40 illustrating the propagation of the data to the second stage, while still being held for this next clock cycle in the first stage as illustrated by block 38. Similarly, the data propagates through the stages until it reaches a last block 42 for the LSB.

In low resolution mode, the most significant bit is instead provided to an input line 44. As can be seen, the latency will be shorter since the earlier blocks have been bypassed. To compensate for this, a latency matched D-latch block 46 is switched into the circuit. This block will basically hold the input until a number of cycles corresponding to what it would take in full resolution mode to switch through to block 48. Latency is required for all of the lines, rather than simply for the first line, since immediately after the first data sample is provided to the input, a second sample is provided, etc., so that multiple analog values are propagating through the stages corresponding to different inputs, in a pipelined manner. A D-latch is chosen because of its minimal current requirements. Much less current is consumed by the D-latch than by the sample and hold, amplifier, summing circuit, ADSC and DASC circuits of each stage.

Figure 4:
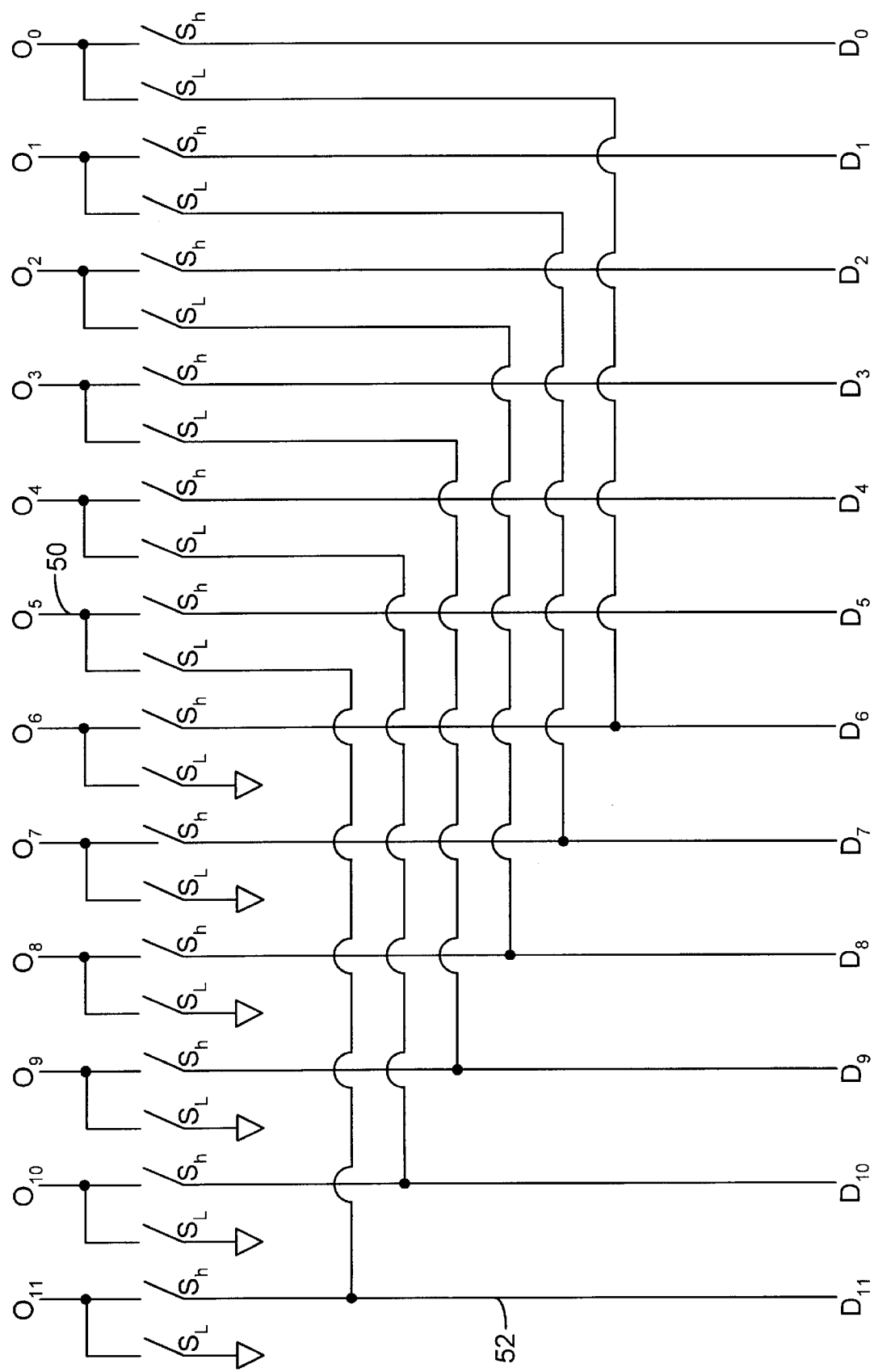
FIG. 4 is a diagram illustrating an embodiment of the shifting circuit for shifting the LSB outputs to the MSB positions.

The lower resolution mode forces the digital output of the ADC to shift 6-bit LSBs to the 6-bit MSBs, (from D5~D0 to D11~D6). The circuit uses a digital MUX to shift the bits as shown in FIG. 4. This simplifies the DSP or ASIC design again because the output digital data word is always MSB justified. If the output digital word was not MSB justified, the DSP would need two different interfaces that would change when the video switched between full and low resolution modes.

For example, as can be seen, output $O_5$ on line 50 is shifted, when switch SL is closed, over to output $O_{11}$ on line 52. Similarly, the remaining bits on lines $O_0$–$O_4$ are shifted over to lines $D_6$–$D_{10}$, respectively.

As will be understood by those of skill in the art, the present invention could be embodied in other specific forms without departing from the essential characteristics thereof. For example, the two resolution modes could be used with other than a pipelined ADC. Additionally, the reduced current could be a higher or lower value, depending upon the desired tradeoff between recovery time and power consumption. Additionally, an alternate embodiment could accept two different latencies for full and low resolution, and could accept the output bits in the LSB positions without shifting. Accordingly, the foregoing description is intended to be illustrative, but not limiting, of the scope of the invention which is set forth in the following claims.

What is claimed is:

1. An analog-to-digital converter circuit comprising:
   an analog input;
   a plurality of digital bit output lines; and
   at least one switch, responsive to a low resolution mode signal, for selecting digital outputs for for only certain of said plurality of digital bit output lines,
   wherein said analog-to-digital converter circuit comprises a plurality of pipelined stages, and said at least one switch bypasses at least one of said stages.

2. The circuit of claim 1 further comprising a bias circuit configured to reduce the amount of current to bypassed stages.

3. The circuit of claim 1 wherein said low resolution mode signal corresponds to a viewfinder mode of a video camera.

4. The circuit of claim 1 further comprising a shift circuit for shifting the LSB outputs to the MSB outputs in response to said low resolution mode signal.

5. The circuit of claim 1 further comprising a latency matching circuit configured to maintain an equal latency for both a high resolution and a low resolution mode.

6. The circuit of claim 5 wherein said latency matching circuit comprises:

plurality of D latches connected to a plurality of LSB pipelines of said circuit; and a second switching circuit for bypassing said D latches in a full resolution mode.

7. The circuit of claim 1 wherein each of said pipelined stages includes:

a sample and hold circuit;

a analog to digital stage converter for providing at least one digital output bit;

a digital to analog stage converter;

a summing circuit connected to outputs of said sample and hold circuit and said digital to analog stage converter; and an amplifier connected to an output of said summing circuit.

8. An analog-to-digital converter circuit comprising:

an analog input;

a plurality of pipelined stages, each stage producing at least one bit of a digital output;

a mode input for receiving a low resolution mode signal corresponding to a viewfinder mode of a video camera;

at least one switch, responsive to a low resolution mode signal, for bypassing a plurality of said pipelined stages;

a bias circuit configured to reduce the amount of current to bypassed stages; and a shift circuit for shifting a plurality of LSB outputs of a plurality of said stages to a plurality of MSB outputs in response to said low resolution mode signal.

9. The circuit of claim 8 further comprising a latency matching circuit configured to maintain an equal latency for both a high resolution and a low resolution mode.

10. The circuit of claim 9 wherein said latency matching circuit comprises:

plurality of D latches connected to a plurality of LSB pipelines of said circuit; and a second switching circuit for bypassing said D latches in a full resolution mode.

11. The circuit of claim 8 wherein each of said pipelined stages includes:

a sample and hold circuit;

a analog to digital stage converter for providing at least one digital output bit;

a digital to analog stage converter;

a summing circuit connected to outputs of said sample and hold circuit and said digital to analog stage converter; and an amplifier connected to an output of said summing circuit.

* * * * *